United States Patent [19]
Gubser

[11] Patent Number: 5,838,964
[45] Date of Patent: Nov. 17, 1998

[54] DYNAMIC NUMERIC COMPRESSION METHODS

[76] Inventor: David R. Gubser, 1171 E. Lassen Ave., Chico, Calif. 95926

[21] Appl. No.: 494,779

[22] Filed: Jun. 26, 1995

[51] Int. Cl.$^6$ .................................................. G06F 17/30
[52] U.S. Cl. ...................... 395/612; 395/888; 364/715.02
[58] Field of Search .................................... 395/612, 611, 395/888, 440, 441, 182.04, 850; 364/715.02

[56] References Cited

U.S. PATENT DOCUMENTS

| | | | |
|---|---|---|---|
| 3,728,684 | 4/1973 | Morganti | 395/888 |
| 4,468,732 | 8/1984 | Raver | 395/613 |
| 5,140,692 | 8/1992 | Morita | 395/605 |
| 5,627,590 | 5/1997 | Hamano | 348/402 |
| 5,627,995 | 5/1997 | Miller | 395/497.02 |

Primary Examiner—Thomas G. Black
Assistant Examiner—Diane D. Mizrahi
Attorney, Agent, or Firm—George W. Finch

[57] ABSTRACT

A dynamic numeric compression method that groups like elements of a data stream and stores the methodology steps to form the groupings so that the data stream can be recovered completely upon decompression. The grouping is accomplished moving an element until it is adjacent a like element wherein the adjacent like element is moved and the original element is returned to the front or its original place in the file. The process is continued until all like elements are positioned at the opposite end of the file resulting in a unique number of moves being required to group a known number of elements in a file of known size together. To decompress, the known size data file is recreated and then filled with elements by reversing the move process.

38 Claims, 10 Drawing Sheets

FIG. 1B

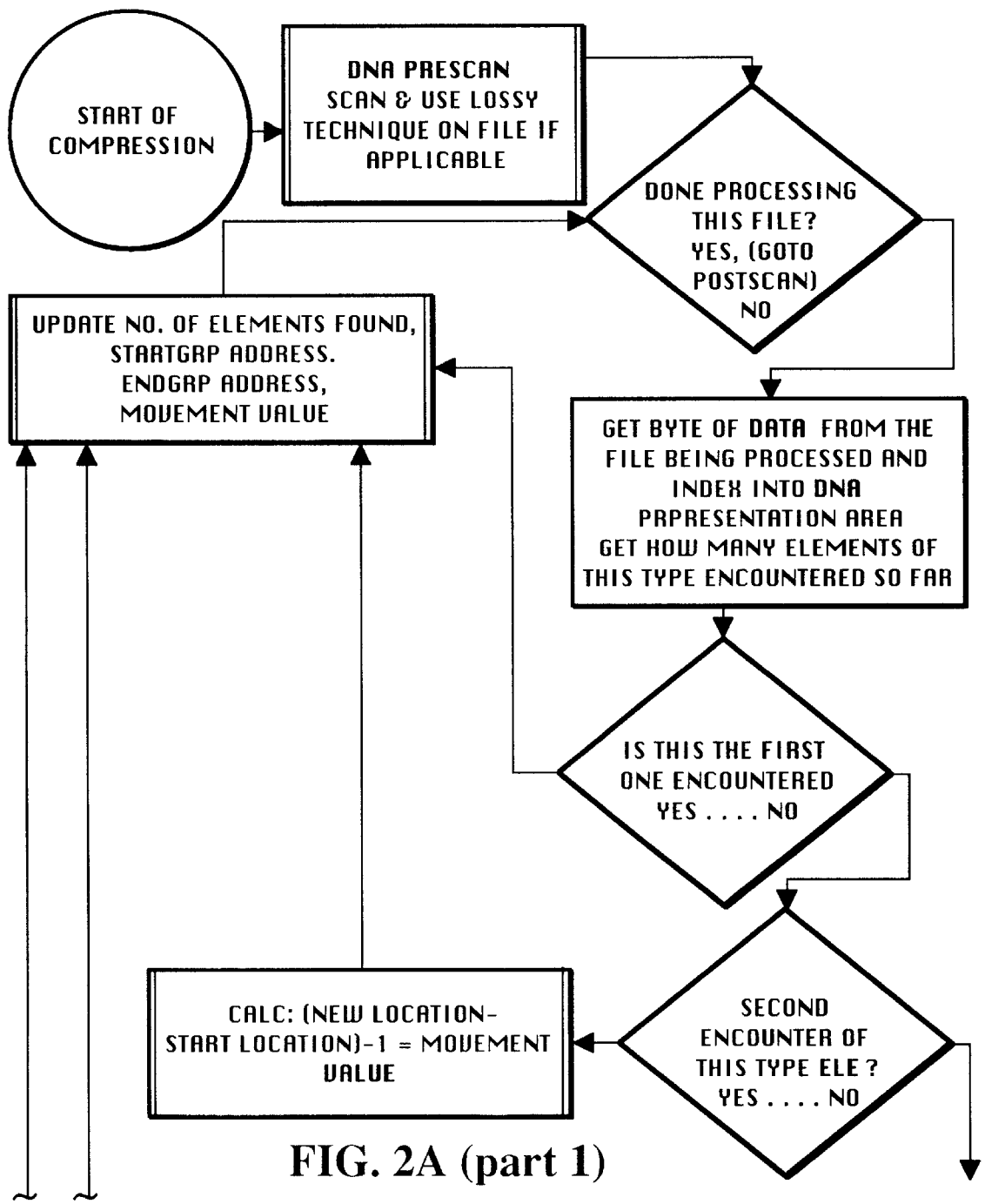
FIG. 2A (part 1)

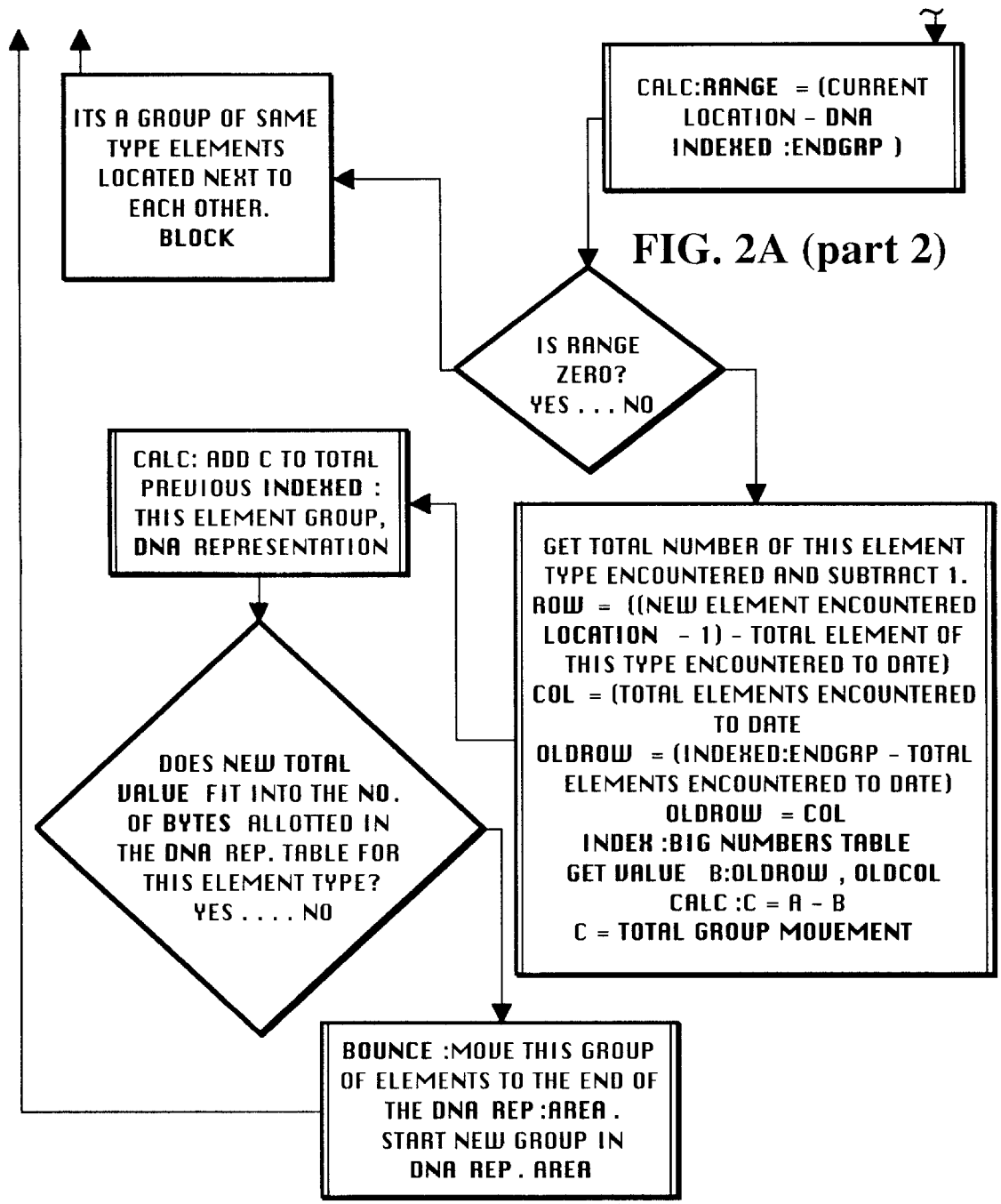
FIG. 2A (part 2)

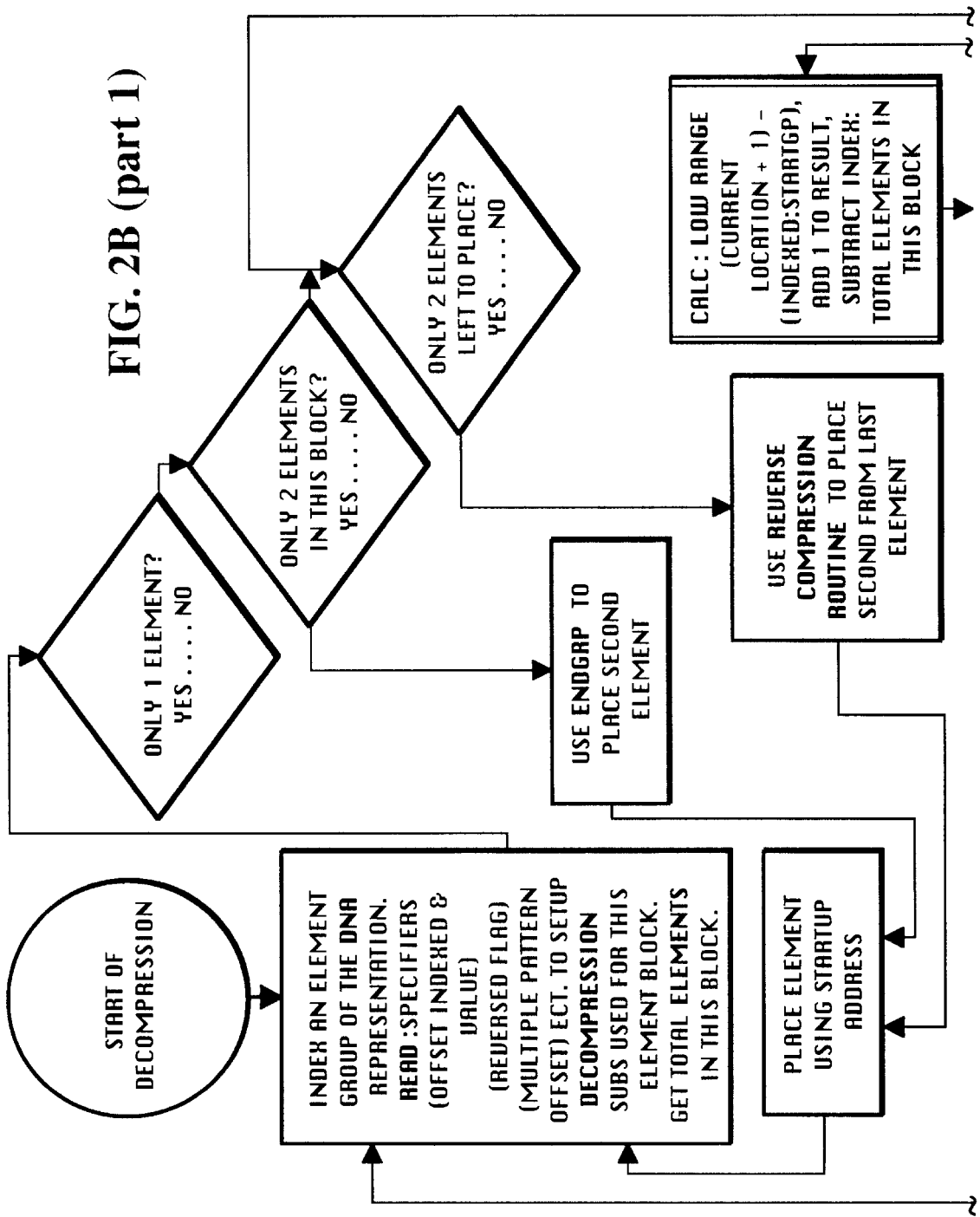
FIG. 2B (part 1)

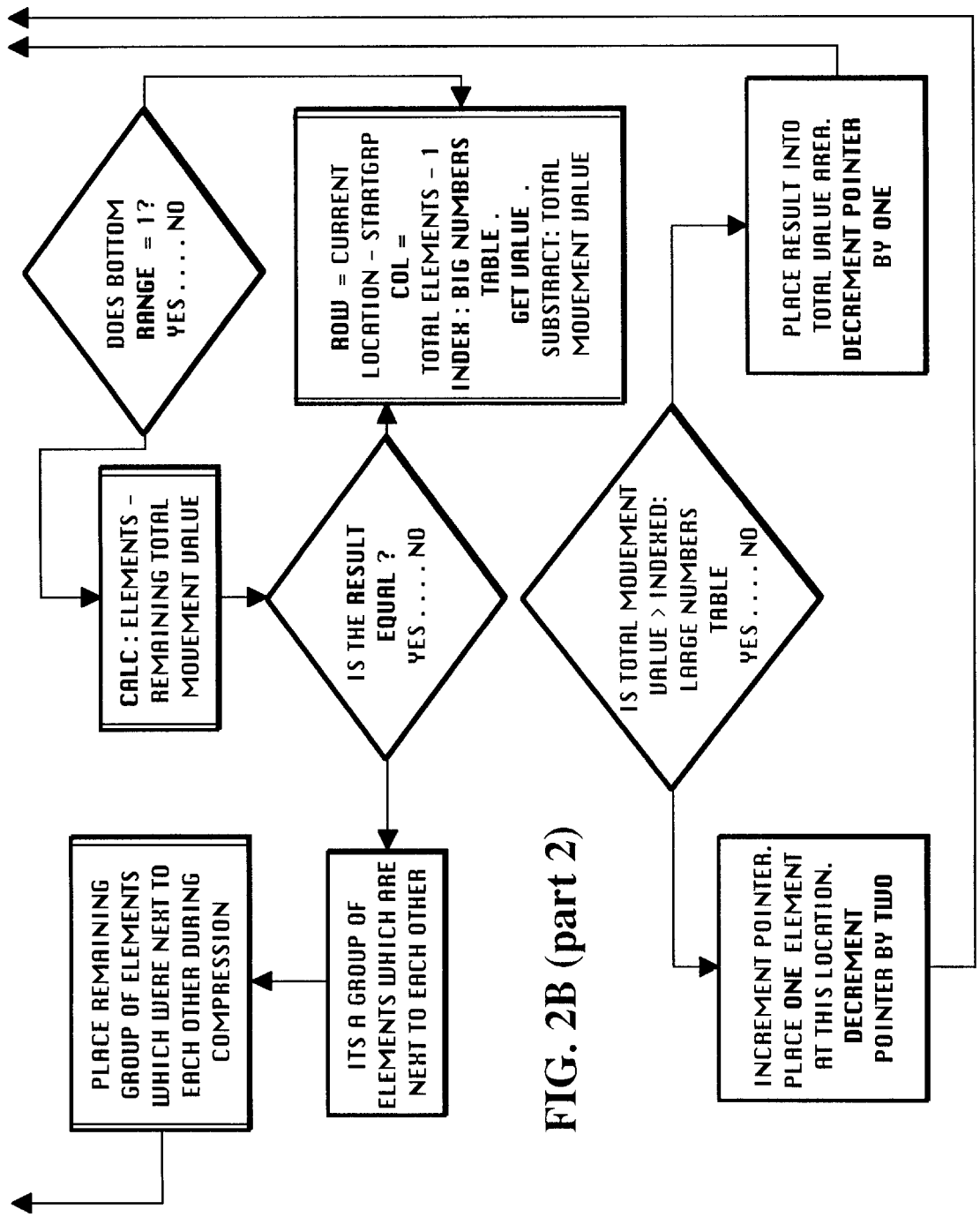
FIG. 2B (part 2)

FIG. 3

DNA Compression /Decompression

COMPRESSION:

| | | |
|---|---|---|
| Original File | 5 6 7 0 4 5 6 6 0 4 7 5 4 6 6 7 4 0 4 6 5 7 6 0 4 5 0 7 4 7 6 0 5 | |
| First Group | 5 0 0 0 0 5 0 0 0 0 5 0 0 0 0 0 0 0 0 0 0 5 0 0 0 0 5 0 0 0 0 0 5 | |
| DNA offset | | OFFSET VALUE = 4 |
| DNA movement | 5 5 5 0 0 0 5 0 0 5 | |
| | 3 elements moving 3 places = 20 | |
| | + 5 elements moving 5 places minus 5 elements moving 3 places ,126-56=70 | |
| | TOTAL MOVEMENT VALUE = 90 | |
| DNA completed | 0 0 0 0 0 5 5 5 5 5 | |
| DNA Reversed * | 5 0 0 5 5 0 0 0 5 5 | REVERSED DNA : VALUE = 48 |
| File Sieve with | | |
| 5's removed | 6 7 0 0 4 6 0 4 7 4 6 7 4 0 4 6 7 6 0 4 0 7 4 7 6 | |
| Next Group | 6 0 0 0 0 6 0 0 0 0 0 6 0 0 6 0 0 0 0 0 0 0 0 0 6 | |
| DNA offset | 6 0 0 6 0 0 0 0 0 6 0 0 0 0 6 6 0 0 0 0 0 0 0 6 | Offset value =1 |
| DNA completed | 0 0 0 0 0 0 0 0 0 0 0 6 6 6 6 6 6 6 | DNA value =7407 |
| File Sieve with | | |
| 5's,6's removed | 7 0 4 0 4 7 7 4 7 7 4 0 4 7 7 0 4 0 7 7 | |
| Next group | 7 0 0 0 0 7 0 7 0 0 7 0 0 0 7 0 0 0 0 7 | |
| DNA offset | 7 0 0 0 7 7 0 0 7 7 0 0 7 7 7 7 | OFFSET VALUE =1 |
| DNA completed | 0 0 0 0 0 0 0 7 7 7 7 7 7 7 7 | DNA = 103 |
| File Sieve with | | |
| 5's,6's,7's removed | 4 0 4 4 4 0 4 0 4 | |
| Next Element | 4 0 4 0 4 0 4 0 4 | No OFFSET possible |
| DNA completed | 0 0 0 4 4 4 4 4 4 | DNA = 161 |
| DNA reversed | 4 0 4 0 4 0 4 0 4 | REVERSED = 140 |

FIG. 4

DNA COMPRESSION / DECOMPRESSION

DECOMPRESSION:

Last group first
Rebuilt movement                                              4 0 4 4 4 4 0 4 0 4

No offset process

Next group                                        7 0 0 0 7 7 0 0 7 7 expand offset of 1                        7 0 0 0 0 7 0 7 0 0 0 7 0 0 0 7 0 7 combined                                  7 0 4 0 4 7 4 4 0 4 7 0 4 0 7 4 7

Next group                      6 0 0 0 6 0 0 0 0 0 6 0 0 0 0 0 6

Expand offset of 1              6 7 0 4 6 0 4 7 4 6 7 6 0 4 0 7 4 7 6 combined              5 0 0 0 5 0 0 0 0 0 5 0 0 0 0 0 5 0 0 0 0 0 5

Next group            5 6 7 0 4 5 6 0 4 7 5 4 6 7 4 0 4 6 5 7 6 0 4 5 0 7 4 7 6 0 5 combined

Decompression Complete 5,838,964

DYNAMIC NUMERIC COMPRESSION METHODS

BACKGROUND OF THE INVENTION

The current industry standard for compressing digital data was developed by STAC Electronics and is known as Stacker. Stacker uses a data compression technique based on an algorithm known as the Stacker LZS™. The current form of LZS™ compresses data so it can be stored with fewer bytes without losing any information. This is accomplished using several techniques including: replacing repeated strings with a single byte token; or replacing repeated bytes with a single byte and a repeat number. For example, if the word "STACKER" appears 50 times in a document, by using a single byte and a repeat number instead of slavishly storing the word fifty times, can result in the reduction of almost three hundred and fifty stored characters and is effective no matter whether the data is to be stored on a disk or transferred through a data channel. The other technique employed by Stacker to reduce storage requirements is to use smaller than normal clusters for storing files. In this way, the Stacker "SmartPack" can be used to reduce wasted space in a storage medium to almost nothing. In technical terms the SmartPack allocates the data to the minimum integral number of storage disk sectors necessary to contain the compressed cluster and decompresses all data as it is read. The Stacker device driver implements a virtual disk with 2 ½ times the capacity of the physical disk, whereas the Stacker LZS™ algorithm is implemented in a computer hardware board or in software. Files such as word processing files, spreadsheets, data bases and many graphic formats compress very well because such commonly contain repeated and redundant information therein. Application programs such as those having the extensions .EXE or .COM for use in IBM compatible PCs do not compress as well. Compressed formats such as ARC and .ZIP and many animated games do not compress at all.

There are other compression techniques used specifically for graphics, such as that disclosed in U.S. Pat. No. 4,558,302 by Walsh and used as the standard graphics compression/decompression method on the InterNet, that have higher compression ratios than Stacker but lose data when compressing and decompressing so that the original image is not duplicated. The Walsh compression/decompression method searches a data stream for the longest patterns that match patterns stored in a table of patterns and then represents each of such patterns with a unique code string in its output data stream. To decompress, the Walsh method reconstructs the original data stream by using the unique code strings to look up the original patterns in the table. Although Stacker and other digital data compression techniques have been commercially successful, there is a need for compression methods that take advantage of the increasing speed of central processing units (CPUs), that can compress digital data into much smaller files so that large effective data transfer rates can be provided over limited band width systems, that can automatically optimally compress data for a wide variety of circumstances and that compress huge files down to manageable sizes if sufficient CPU time is available so such files can be stored without resort to expensive, gargantuan storage systems.

SUMMARY OF THE PRESENT INVENTION

The present invention is a dynamic numeric compression method that compresses "more into less" at compression ratios and speeds never before possible. The method comprises grouping all like elements of a data stream and keeping track of the methodology steps to form the groupings so that the data stream can be recovered completely upon decompression. The size of the compression blocks can be chosen to optically fit the computer, computer memory and data transfer requirements of the user. The compressed data can be compressed over and over using this method when sufficient CPU time is available.

The present method is versatile in that if additional CPU time is available or a slight wait can be tolerated, even more compression can be obtained. In some embodiments thereof, the method applies variable compression depending upon current situations. The present dynamic numeric method can be adapted to any type of digital computer system and works on all text and graphic files without any loss of data. It can provide real time compression that is effectively transparent to the end user and achieves compression ratios that far exceed existing standards. In addition, the present method has a built-in unique feature that allows non-real time compression ratios without data loss, which can be controlled by the user so that additional compression can be acquired as faster CPUs are available. The result of use of the present method is that large amounts of data can be stored on economical hard disk drives, high resolution graphics that uncompressed would swamp the storage capabilities or data transmission capabilities of computers can be used, and transmission speeds over restricted band width communication means can be increased.

The present dynamic numeric method is so versatile, it can be used for: high definition digital data transfer systems such as high definition television, high definition scientific data transmissions, and high definition military data transmissions; digital telecommunications such as voice data, visual phone data, wireless telephone, digital radio broadcasting, satellite telephone, and previously encrypted military transmissions; and digital data storage and retrieval media such as, CD ROM, computer hard and floppy disks, RAM, ROM, and tape.

In the preferred embodiment, the compression and decompression method dynamically adjusts to the most practical ratio fox each computer system. Faster hardware, therefore, produces higher compression ratios and faster speeds of transmission of data essentially having a multiplying effect on increases in CPU speed. The compression ratio also can be pre-set by the user or producer of the method implementing hardware or software used in causing the method to operate on a CPU, or the compression ratio dynamically adjusted by the software program itself for various compression levels. There even can be different levels of compression for each type of computer. This dynamic feature makes it possible for the consumer to trade-off the cost of CPU speed versus the cost of hard disk drive storage capability when assessing the most cost-effective computer system for a particular intended use.

The implementation of the method can be in software, hardware or a combination of both. Hardware is preferred when high speed continuous compression and decompression is needed to remove such from the CPU, whereas implementation in software, being more economical, is preferred when only occasional compression and decompression is required because the user can then trade time required to run the software versus the cost of the special compression hardware. The method, although highly recursive, requires relatively few bytes of code for the compression and decompression in its basic form.

Therefore it is an object of the present invention to provide versatile compression and decompression means that can be used in a wide variety of circumstances from conserving disk space to allowing the transfer of high resolution digital composite video and audio signals over a limited band width.

Another object is to provide a compression method that dynamically adapts to the CPU on which it is being run. Another object is to provide compression means that are easily controllable by their users and providers.

Another object is to provide a lossless compression technique that can be used after lossy compression techniques have been used to compress a data stream, so that the data stream can be compressed even further.

Another object is to reduce the requirements for expensive large hard disk systems in desktop computer systems by using the latest CPU speeds to their maximum capacity.

Another object is to provide a lossless compression technique that can be used with any digital data transmission or digital data storage techniques.

These objects and advantages will become apparent to those skilled in the art after considering the following detailed specification in combination with the following sheets of drawing wherein:

BRIEF DESCRIPTION OF THE DRAWINGS

FIGS. 1A and 1B are an illustration of the principles of the present invention;

FIGS. 2A and 2B are a flow diagram of a software embodiment of the present invention;

FIG. 3 is a illustration of a complete DNA compression including a sieve method to allow higher compression;

FIG. 4 is a illustration of a decompression after the method illustrated in FIG. 3 has been accomplished;

DETAILED DESCRIPTION OF THE PRESENT EMBODIMENTS

The present method is a Dynamic Numeric Algorithm (DNA) process, which compresses and decompresses any type of digital information while maintaining the integrity of the original data. DNA can also be used with other compression programs or techniques or on itself to gain further compression. This is possible because after DNA has processed the original file, the newly created DNA representation can be reprocessed as if it were an original file. DNA can be used on the files it generates repeatedly, until no greater compression is possible or is desired.

Digital data normally is stored in the form of binary values. A bit is the smallest binary value and has two conditions, either off (0) or on (1). A Byte is composed of eight (8) binary bits and has 256 possible combinations.

Example:

00000000=0
00000001=1
00000010=2
00000011=3
00000100=4
11111111=255

Digital information is composed of a string or array of BYTES placed in order. It makes no difference whether the information is characters, pixel positions, intensities or colors, or numeric values. All are stored as numeric information. For example, the word "Data" is conventionally represented by the numeric sequence:

| D | a | t | a |
|---|---|---|---|
| 68 | 97 | 116 | 97. |

Different types of computer programs such as word processor programs, graphics programs, spread sheets, data bases, communication programs and the like, use differing formats to store the information in data files created during their use. However, the end result of what they store or transmit is always a group of numbers with values of 0–255 stored in order. The programs (the instructions to the computer how to react to inputs thereto) themselves are stored as files in the same manner.

Figure 1A:
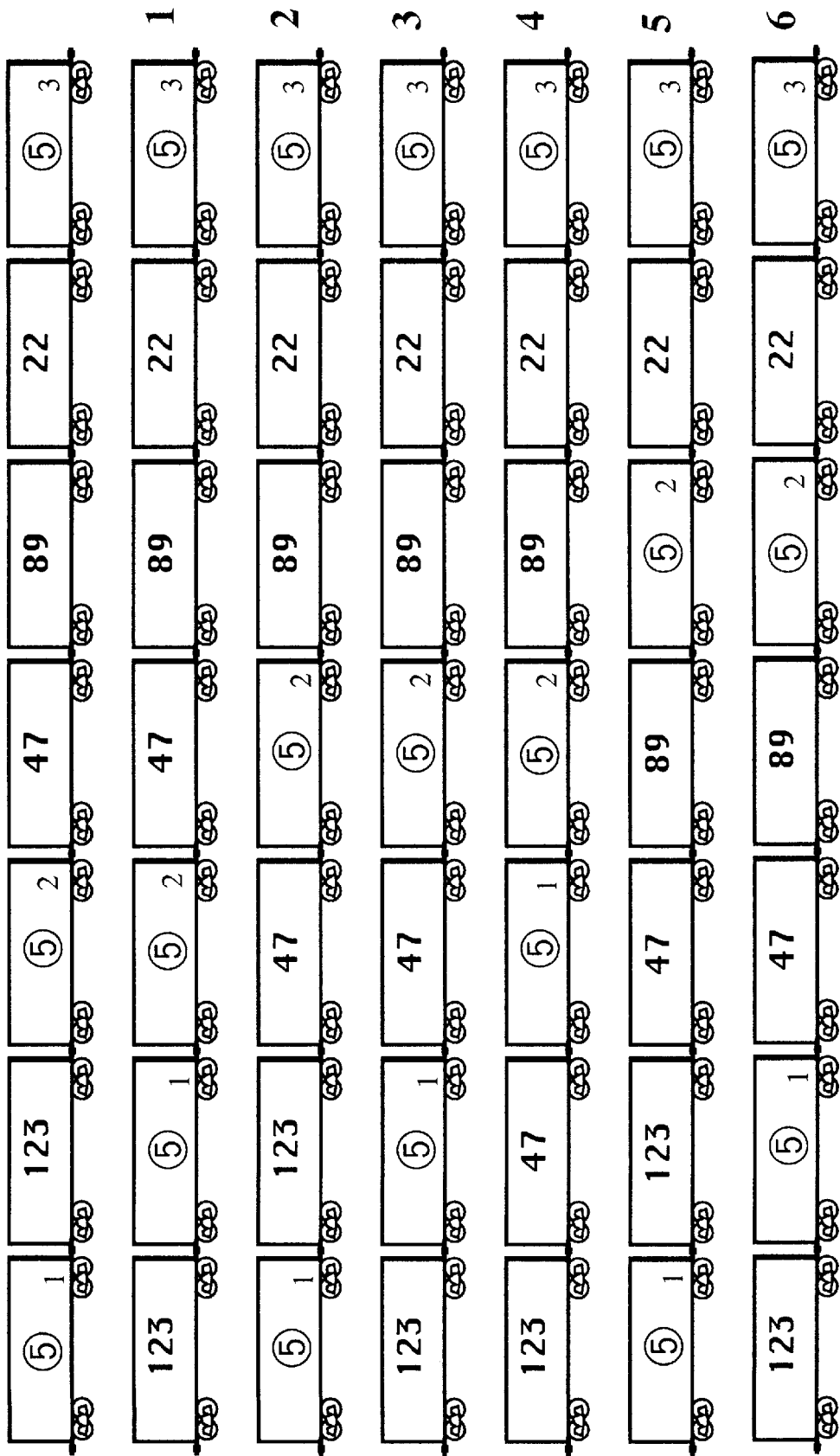
Figure 1B:
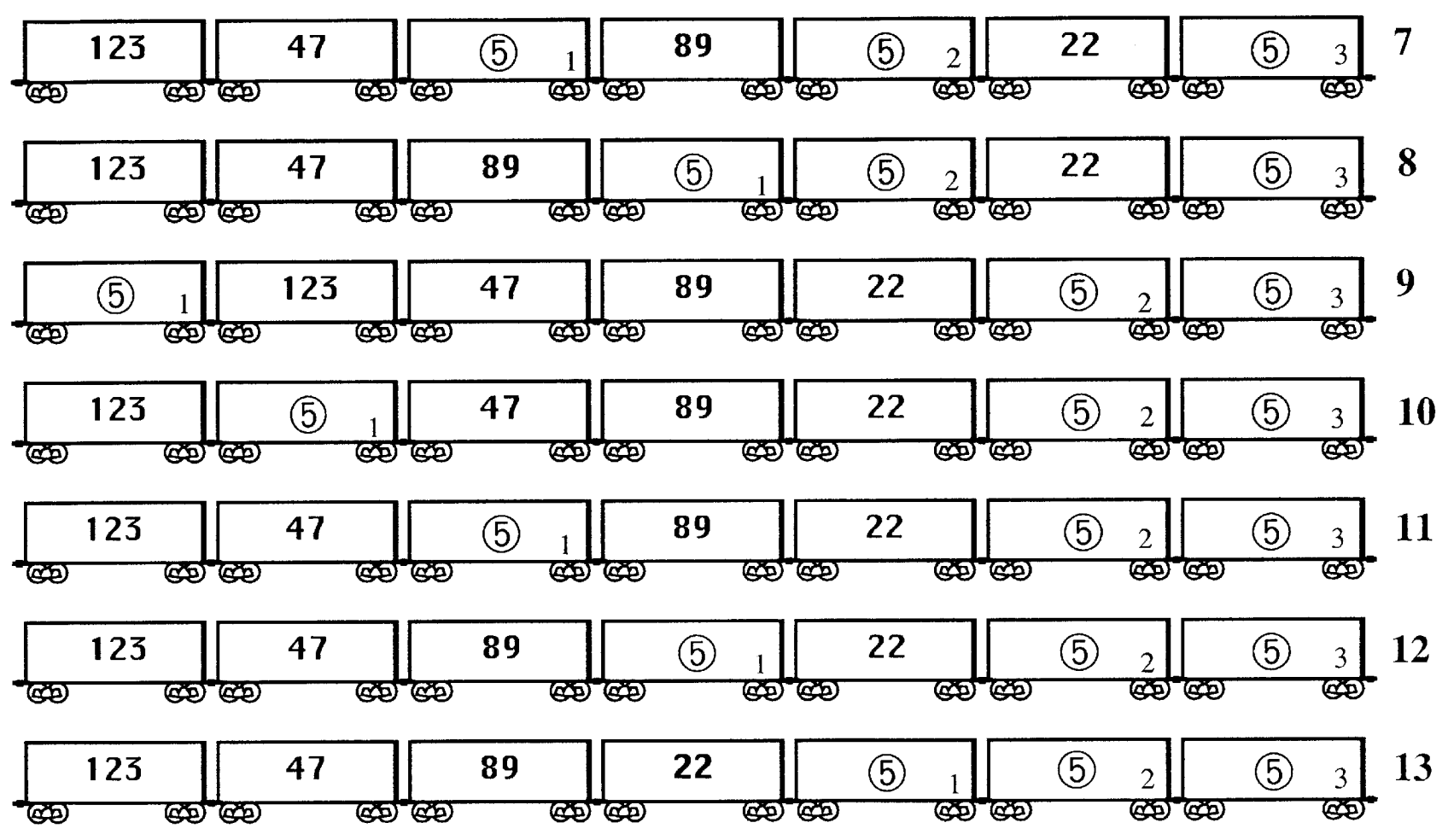

It is important to understand that digital information is always stored as a sequence of numbers and the present method moves such numeric values around in a logical sequence so that patterns within the data are not lost, and in fact are recognized to allow compression. As a simple illustration consider FIGS. 1A and 1B where a string of railroad boxcars is illustrated.

Each boxcar in the train holds one number from 0 to 255. If the train is left alone and its boxcars are not rearranged, a certain boxcar at an ordered position in the boxcar string will always hold the same number. To a computer, each boxcar holds specific values, which it can interpret to be a program or a program's data. Note that a computer's operating system, along with other programs understand which trains are data trains and which trains are program trains.

Since computer information is stored as numbers in a line, a program or data as shown in FIG. 1 might look like this:

| LOCATION of boxcars #: | 0 | 1 | 2 | 3 | 4 | 5 | 6 |
|---|---|---|---|---|---|---|---|
| CONTENTS of the boxcars: | 5 | 123 | 5 | 47 | 89 | 22 | 5 |

DNA looks for the occurrence of the same value in a program. The small program above has three 5's in it.

One 5 at boxcar #0
One 5 in boxcar #2
One 5 in boxcar #6

The locations where the five's occur in the above program can be specified in the following way. There are five's in the boxcars below which have a 1 inside.

$5_1 \ 123_1 \ 5_2 \ 47_1 \ 89_1 \ 22_1 \ 5_3$

DNA processes this information as follows. The objective is to count the distance (relationship) between the boxcars holding the same value, in this case, the boxcars holding five's. Mathematically, it is determined what number of movements it would take to place all the boxcars with the number five and group them at the right hand side, adjacent the last five encountered as has been done in the lowest string of boxcars. By using a specific methodology to move the five's, or whatever element group being dealt with, to the right, the five's can be represented by fewer bytes.

Below is a representation of how DNA moves the boxcars together toward the right. Move the first boxcar with a five inside, to the right until it runs into another boxcar holding the same value keeping track of the positions moved.

$123_1 \leftarrow \rightarrow 5_1 \ 5_2 \ 47_1 \ 89_1 \ 22_1 \ 5_3$

The count is now 1. When a boxcar can not be moved to the right because of another "five" boxcar, it is repositioned back to the far left and the "five" boxcar it ran into is moved one position to the right on the same count. Thus $5_1\ 123_1\ 47_1 \leftarrow \rightarrow 5_2\ 89_1\ 22_1\ 5_3$
The count is now 2
$123_1 \leftarrow \rightarrow 5_1\ 47_1\ 5_2\ 89_1\ 22_1\ 5_3$
The count is now 3
$123_1\ 47_1 \leftarrow \rightarrow 5_1\ 5_2\ 89_1\ 22_1\ 5_3$
The count is now 4 And again
$5_1\ 123_1\ 47_1\ 89_1 \leftarrow \rightarrow 5_2\ 22_1\ 5_3$
The process continues. Note that when the elements group, the lead element moves, if possible.

| | |
|---|---|
| 123 5 47 89 5 22 5 | Count is 6 |
| 123 47 5 89 5 22 5 | Count is 7 |
| 123 47 89 5 5 22 5 | Count is 8 |
| 5 123 47 89 22 5 5 | Count is 9 |
| 123 5 47 89 22 5 5 | Count is 10 |
| 123 47 5 89 22 5 5 | Count is 11 |
| 123 47 89 5 22 5 5 | Count is 12 |
| 123 47 89 22 5 5 5 | C6unt is 13 |

No further movement is possible and the result is three "five's" grouped to the right and it took 13 movements to group them together.

DNA expresses the previous information in the following manner.

NUMBER of BYTES, is the 1st number in the DNA representation, It indicates how many bytes with values from 0 to 255 (or any other byte size, i.e. 0 to 1, 0 to 3, 0 to 7, 0 to 15, 0 to 31, 0 to 65, 0 to 127) are included in the entire BLOCK of ELEMENTS, and it equals 6 (i.e. $6_1$, $5_2$, $3_3$, $0_4$, $7_5$, and $13_6$). It would take an exceptional file size for this number to require more than one eight bit byte. However, if the bytes contain fewer bits, multiple bytes to express NUMBER of BYTES become more common, and in the case of one and two bit systems, mandatory.

ELEMENT TYPE is the 2nd number. It indicates what ELEMENT or number is being redefined, which in this example equals 5. This number always can be expressed by one byte.

ELEMENT TOTAL is the third number. It is the count of the total number of elements in the file or block, which in this example equals 3. This number could approach the size of the ENDING LOCATION if the STARTING LOCATION is zero and the block is comprised of mostly the ELEMENT so the number of bytes to express this number is related to the file size or block of the file size being compressed. However a ELEMENT TOTAL near in size to the ENDING LOCATION would result in an unusually small COUNT.

STARTING LOCATION is the fourth number and is the position of the first matching ELEMENT encountered. In this example it is 0. The STARTING LOCATION could take multiple bytes, but it will always be equal to or smaller than the ENDING LOCATION.

ENDING LOCATION is the fifth number and indicates the position of the last ELEMENT in the group, which is this example equals 7. The ENDING LOCATION could take multiple bytes, but it will always be equal to or larger than the STARTING LOCATION.

COUNT is the sixth number and is the sum of all the moves it took to place all of the ELEMENTS together. In this example it is 13. The COUNT can be the largest number and take a large number of bytes to express. The ELEMENT that is present in the largest quantity in a well mixed element file, will have the highest count and determination of a DNA representation thereof will take the most time. However, since the rest of the DNA representations define all of the other places in the original file, the ELEMENT present in the highest number need not be DNA represented at all, since upon decompression, it can merely be filled into every defined empty space remaining in the file.

Note that in a rigid byte structure, if two bytes are used in the third, fourth, and fifth locations, one byte can be used in the first and second locations and a file size or block of 65535 bytes can be operated on. The first location can indicate a total of 256 bytes being present and the sixth location will not require the remaining 248 bytes ($256^{248}-1$ or over $10^{600}$) to express the worst case COUNT to move 32768 elements from the left side of a file to the right.

The above definitions can be changed to redefine larger or smaller original files into their DNA representations. The DNA representation of the above compression would be 6 5 3 0 6 13 made up as follows:

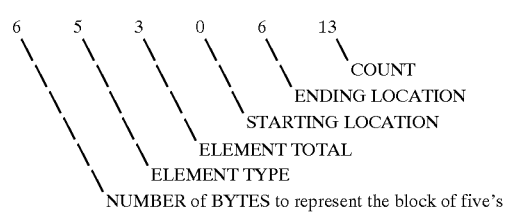

* The COUNT quickly can become a very large number as the process takes place. The values are stored temporarily in prospective bytes. Note that:

| | |
|---|---|
| 1 byte can hold values from 0 to 255 | or $256^1$ |
| 2 bytes can hold values from 0 to 65,535 | or $256^2$ |
| 3 bytes can hold values from 0 to 16,777,215 | or $256^3$ |
| 4 bytes can hold values from 0 to 4,294,967,295 | or $256^4$ |
| 5 bytes can hold values from 0 to 1,099,511,627,775 | or $256^5$ |
| etc. | |

DNA mathematical relationship

The following shows the relationship between the ELEMENT locations. For 10001, there are three 0's between the ELEMENTS (E). A simple count of 3 would describe the RANGE (R) between elements so that the DNA representation for the ones would be 6 1 2 0 4 3 and the DNA representation for the ones and zeros would be 6 1 2 0 4 3 6 0 3 1 3 0. The 6 0 3 1 3 0 can also be expressed as 5 0 3 1 3 since logic traps in the decompression method could catch that the three zeros must be between one and three and no other ELEMENTS could be in between, so there is no COUNT. Moving additional groups of elements needs additional explanation.

For 11001, the second element from the left will be called the LEAD ELEMENT. Its RANGE {the SPACES between its location and the LAST ELEMENTS (far right) location and the LEAD ELEMENT} is simply two (2). For every movement the second element makes, the first element must return to the beginning and move to the right until the second element either moves to the right or the process ends due to all the elements grouping together so that the DNA representation would be $6_1\ 1_1\ 3_1\ 0_1\ 4_1\ 8_1\ 6_0\ 0_0\ 2_0\ 2_0\ 3_0\ 4_0$ (subscripts used to indicate element type). As will be seen hereinafter, the DNA expression for the zero elements ($6_0\ 0_0\ 2_0\ 2_0\ 3_0\ 4_0$) need not be present because the decompression method involves filling elements into a zero matrix, which automatically places zeros anywhere another ELEMENT TYPE is not present.

For 111001, R=Z−(E+1) or in this case: 2=6−(3+1), RANGE=the location of the last element encountered (Z), minus the quantity one plus the number of ELEMENTS moving. Note that while processing, after a block is processed, when a new element is located the RANGE is increased by the distance from the END LOCATION minus the START LOCATION and minus the number of ELEMENTS grouped to get a correct RANGE VALUE. If R=O then the number of elements would increase by one and the END LOCATION would increase by one, that is a block of the same elements together has been located so that the DNA representation for the ones and zeros would be $6_1\ 1_1\ 4_1\ 0_1\ 5_1\ 9_1\ 6_0\ 0_0\ 2_0\ 3_0\ 4_0\ 5_0$. No compression takes place in the above examples because the block of data chosen is too small, but suppose the data was 9 9 9 9 9 9 9 9 9 9 9 9 9 9 1 (fourteen nines and a one). Then the DNA representation would be 5 1 1 14 14 5 9 14 0 13 or ten bytes to express fifteen. It could also be 4 1 1 14 5 9 14 0 13 with 4 1 1 14 representing: NUMBER of BYTES; ELEMENT TYPE; ELEMENT TOTAL; and START and END LOCATION respectively, as will be explained hereinafter. The compression for one pass increases with file size and on average reduces file size about 3.5 times per pass for normal word-processing files.

If RANGE>O then the lead element is subtracted from the total elements being moved. If the remaining elements total 1, the distance from the start to the location of the lead element minus one, is counted R times to achieve the correct value.

If RANGE>O and the total elements left after subtracting the lead element $\geq 2$ then a table like Table 1 can be used to find the correct value without resort to computation routines.

Three or more elements moving like in 1110001 enables the use of the following formula to calculate the values needed to group the elements together.

Again, the lead element (third from the left) has only to cover the range (in this case 3 open spaces)
However, the equation $$V = (y - 2)\left(\frac{(y+1)}{2}\right) \quad (1)$$

which generates the second column of Table 1 (where y stands for the range) and the additional equation $$A = V\left(1 + \frac{y}{I}\right) \quad (2)$$

that generates columns $\geq 3$ (where I references the column number greater than 2), aids in calculating the movements necessary to get the numerically accurate result. The combined equation is as follows:

$$A = \left\{ (y+2)\left(\frac{(y+1)}{2}\right)\left(1 + \frac{y}{I}\right) \right\} - 1 \quad (3)$$

where y is the range or number of spaces to move and I is the total number of elements moving. Equations (1), (2), and (3) above can be used to generate all of the necessary values for a complete DNA table. These equations may be used by themselves and no table is necessary but precalculating Table 1 for loading into memory speeds processing, so long as enough memory is available that a memory swapping scheme or virtual memory using a disk is not required. Note that in Table 1, first element movement is not calculated since first element movement is simply the range. The two elements are calculated by range multiplied by the distance the following element has to cover for each movement of the lead element. Three or more elements are calculated using the third, fourth, fifth, etc. columns or Equation (3) above. Three elements moving two spaces would be indexed as 3 across and 2 down. i.e. the value 10, subtract 1=9.

TABLE 1

| | | NUMBER OF ELEMENTS (across) | | | | | |
|---|---|---|---|---|---|---|---|
| | | 2 | 3 | 4 | 5 | 6 | 7 | etc. |
| RANGE | 1 | 3 | 4 | 5 | 6 | 7 | 8 |
| (down) | 2 | 6 | 10 | 15 | 21 | 28 | 36 |
| | 3 | 10 | 20 | 35 | 56 | 84 | 120 |
| | 4 | 15 | 35 | 70 | 126 | 210 | 330 |
| | 5 | 21 | 56 | 126 | 252 | 462 | 792 |
| | 6 | 28 | 84 | 210 | 462 | 924 | 1716 |
| | 7 | 36 | 120 | 330 | 792 | 1716 | 3432 |

Justification:
3 elements moving 2 spaces

| | Count |
|---|---|
| 111001 | |
| 110101 | 1 |
| 101101 | 2 |
| 011101 | 3 |
| 110011 | 4 |
| 101011 | 5 |
| 011011 | 6 |
| 100111 | 7 |
| 010111 | 8 |
| 001111 | 9 |

The bolded values below show the mirror image relationship of the values in Table 1 meaning that the Element # and Range can be exchanged at any time,

TABLE 1

| | | NUMBER OF ELEMENTS (across) | | | | | |
|---|---|---|---|---|---|---|---|
| | | 2 | 3 | 4 | 5 | 6 | 7 | etc. |
| RANGE | 1 | 3 | 4 | 5 | 6 | 7 | 8 |
| (down) | 2 | 6 | 10 | 15 | 21 | 28 | 36 |
| | 3 | 10 | 20 | 35 | 56 | 84 | 120 |
| | 4 | 15 | 35 | 70 | 126 | 210 | 330 |
| | 5 | 21 | 56 | 126 | 252 | 462 | 792 |
| | 6 | 28 | 84 | 210 | 462 | 924 | 1716 |
| | 7 | 36 | 120 | 330 | 792 | 1716 | 3432 | resulting in a correct indexed value given while requiring storage of only about half values as in Table (2),

TABLE 2

| | | LARGEST NUMBER OF ELEMENTS or RANGE (across) | | | | | |
|---|---|---|---|---|---|---|---|
| | | 2 | 3 | 4 | 5 | 6 | 7 | etc. |
| SMALLEST | 1 | 3 | 4 | 5 | 6 | 7 | 8 |
| NUMBER OF | 2 | 6 | 10 | 15 | 21 | 28 | 36 |
| ELEMENTS | 3 | | 20 | 35 | 56 | 84 | 120 |
| OR RANGE | 4 | | | 70 | 126 | 210 | 330 |
| (down) | 5 | | | | 252 | 462 | 792 |
| | 6 | | | | | 924 | 1716 |
| | 7 | | | | | | 3432 | and most of those numbers can be generated by a computationally non-intensive method of adding diagonal numbers (underlined) of the Table (2) to generate the larger numbers (double underlined) as:

TABLE 2

| | | LARGEST NUMBER OF ELEMENTS or RANGE (across) | | | | | |
|---|---|---|---|---|---|---|---|
| | | 2 | 3 | 4 | 5 | 6 | 7 etc. |
| SMALLEST | 1 | 3 | 4 | 5 | 6 | 7 | 8 |
| NUMBER OF | 2 | 6 | 10 | 15 | 21 | 28 | 36 |
| ELEMENTS | 3 | | 20 | 35 | 56 | 84 | 120 |
| OR RANGE | 4 | | | 70 | 126 | 210 | 330 |
| (down) | 5 | | | | 252 | <u>462</u> | 792 |
| | 6 | | | | <u>462</u> | +e,dus 924+e, uns | 1716 |
| | 7 | | | | | | 3432 | with the central diagonal line of numbers being generated by doubling the number there above or assuming that the normal RANGE adjacent number (462) had not been removed. This DNA table generation by addition can be expressed as:

$$T(y,x+1)=T(y,x)+T(y-1',x+1) \quad (4)$$

While DNA is processing a file, a number outside the matrix might be generated. In other words, there are more elements, or the range is greater than the size of the table in memory. DNA uses three methods to handle these types of unexpected events. The needed new value is generated using Equation (1), the last entries for the DNA table are extracted and additional values are generated in a temporary matrix using the addition method described above, or the program BOUNCES the total information it has gathered to the end of the DNA representation table and starts over for that ELEMENT downstream from the point the numbers got too large so that before the bounce: 5 23 48 104 27 193 254 128 19 27 42 93 61 103 123 4 45 92 61 122 135 56 34 91 23 8 19 23 25 222 123 129 142 8 19 28 42 96 104 212 101 and thereafter, 8=the number of bytes needed to represent the element group 19, 23 represents the number of 19s that were located between address "boxcar" 25 and 222, and 123 129 142 (8,094,094 to the base 10) is the COUNT value that was generated up to this point, which grouped the 19's together at position 222.

If another 19 element was located while the compression process continued, the data (at location 226) and the location of that 19 was outside of the DNA table and the use of the first two methods of computation to add a new value to the COUNT were avoided, the information group is moved to the end of the DNA representation table and the process is restarted as if no 19s had been located previously.

DNA REPRESENTATION TABLE w/BOUNCE 5
23 48 104 27 19 254 128 19 27 42 93 61 103 123
4 45 92 61 122 135 56 34 91 23 5 19 1 226 226 9
19 28 42 96 104 212 101 8 19 23 25 222 123 129
142

While the original file is being processed, the DNA representation table may be established uniformly with enough space allocated for each group. At the end of processing, the information is concatenated to reduce overall size of the DNA representation table, i.e. the need for the number of bytes to represent for each BLOCK.

The new values 5 19 1 226 226 are used to determine the new group in the place of the 19s that were BOUNCED. The "5" represents the number of bytes used to represent the new group, the "19" represents the element type, the "1" represents the element count, and the "226"s represent the new starting and ending addresses. (A TOTAL COUNT to assess movement is not needed due because the starting and ending location of the ELEMENT is identical). When concatenated, if only one ELEMENT or BLOCK of ELEMENTs remain and the starting and ending addresses are the same, the ending address could also eliminated, which reduces the BLOCK count.

Once the BOUNCE has been accomplished, values can continue to be added from the equation or table as additional 19s elements are encountered. If necessary, BLOCKS can be bounced as many times as needed or desired to process the original file.

During compression or simple DNA representation, the START LOCATION is the position in the file being compressed where the first ELEMENT in a BLOCK is located. The END LOCATION is the position where the last ELEMENT in the particular element block was located. For example, if the original data is:
5 1 2 9 5 7 1 2 9 5 5 5 5 5 5
the complete DNA REPRESENTATION is:

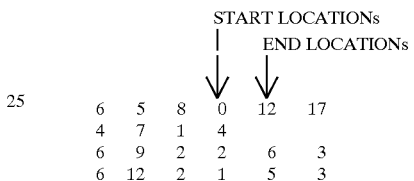

When a BOUNCE occurs, the new STARTING LOCATION for the ELEMENT GROUP can be used as an offset into the DNA TABLE which means the new BLOCK is acted on as if the STARTING ADDRESS in the BLOCK were at 0. This allows the best use of the table or formula and smaller overall COUNT numbers to be generated during compression.

For example,

TABLE 2

| | | LARGEST NUMBER OF ELEMENTS or RANGE (across) | | | | | |
|---|---|---|---|---|---|---|---|
| | | 2 | 3 | 4 | 5 | 6 | 7 etc. |
| SMALLEST | 1 | 3 | 4 | 5 | 6 | 7 | 8 |
| NUMBER OF | 2 | 6 | 10 | 15 | 21 | 28 | 36 |
| ELEMENTS | 3 | | 20 | 35 | 56 | 84 | 120 |
| OR RANGE | 4 | | | 70 | 126 | 210 | 330 |
| (down) | | | | | 252 | 462 | 792 |
| | | | | | 462 | 924 | 1716 | if the new STARTING LOCATION where a new BLOCK was started is 4,232, and one or more elements were to be moved to the 4,237 location, the starting address is used as an offset to zero and the range is calculated by subtracting the starting location from the ending location. 4237−4232=5 which would give the RANGE or Y. The calculation is then continued by the process described above to generate the total COUNT. The next time a same type element is encountered, the new movement number is simply added to the previous total COUNT until, either the file is processed or a bounce occurs. If a BOUNCE occurs, the process simply starts again at the new START LOCATION. Note that in Table (2), each value to the right of the previous row value is 1 plus the sum of the previous row's column. If during compression, a value minus 1 is used to get the sum total of the previous column, and used to calculate the initial location (last element position located, i.e. ((((ENDGRP)−

1)-(STARTGP))-(ELEMENTS-1)), to calculate range, the information can be used to move down the column (from the beginning of the column) go over 1 column to the right, pick this value up, subtract 1 from it and subtract it from the previous value (the above SUM). This new value gives the sum of all movements necessary to move this block to elements to the newly found element. This reduces the number of calculations needed during compression substantially.

The DNA result area might look as follows during processing:

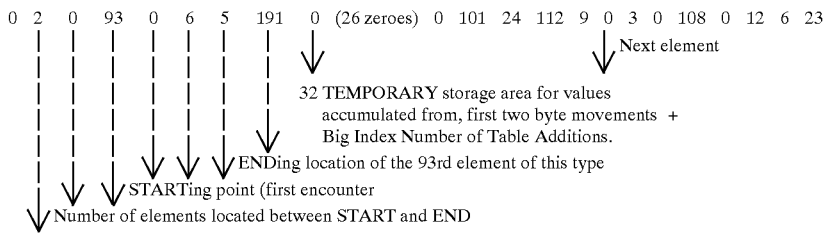

Element type
Next element →3 0 108 0 12 6 23 0 0 00 00 0 0 0 0 0 0 0 0 0 0 0 0 0 0 0 0 0 0 0 7 24 etc.
A concatenated DNA representation (first pass, Postscan) would be as follows

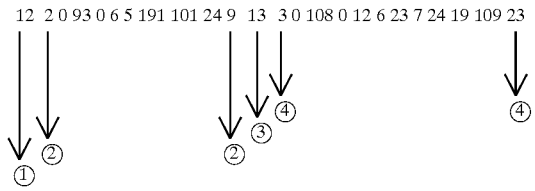

Where:
① Twelve additional bytes to represent this block.
② Element type (one byte), how many located (two bytes), Start (two bytes), End (two bytes), Movement value (four bytes).
③ Thirteen additional bytes to represent this block.
④ Element type (one byte), how many located (two bytes), Start (two bytes), End (two bytes), Movement value (five bytes).
If before POSTSCAN during processing, a ninety fourth encounter of the element type "2" was encountered and the value needed to move the first ninety three "2"s toward the ninth fourth element's location was greater than 32 bytes wide or went of the end of the large number table matrix (Table 2 etc.), the entire representation of the "2"s block could be bounced to the end of the DNA representation in the following manner.

Before bounce:

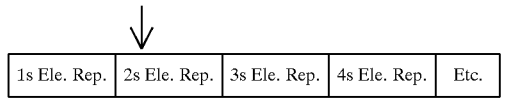

After bounce:

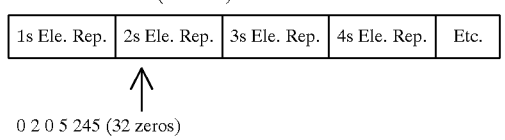

If additional "2"s are encountered, they are added to the new "2"s Element Representation.

The START LOCATION combined with the END LOCATION are really a window or segment of the area where a group of same type ELEMENTS were processed until a BOUNCE occurs or a single pass of the processing of the file is completed. As noted above, DNA can be used to process original data files or reprocess DNA files repeatedly without loss of integrity of the original data file. The number of reprocessing passes that can be performed is unbounded, however at some point, no additional compression takes place. Usually, before such point is reached, the amount of compression per pass is reduced so much, that further compression passes are stopped because their value is not worth the expenditure of additional computer time. Generally, the size of the compressed data in each pass is compared to the size of the data after the previous pass. If a compression ratio of at least 2:1 has not been achieved, further compression passes are not performed. If unlimited computer time is available and the object is to compress the data to its minimum size, the process can be continued until no appreciable compression results, without loss of data.

The expression of eight bit bytes as ones and zeros or as numbers from zero to two hundred fifty five is not required, and in some instances, a more efficient compression takes place if the data and/or the DNA is converted into hexadecimal (HEX). If the original data file was:
0 0 255 1 255 1 255 1 255 1 255 1 2 0 255 1 2 0 255 2 2 0 255 1 2 0 255 2 2 0 255 2 255 1 2 0 255 1 2 0 255 2 2 0 255 0 0 0 0 0 0 0 0;
then converted to HEX, it would be expressed as:
00 00 FF 01 FF 01 FF 01 FF 01 FF 01 02 00 FF 01 02 00 FF 02 02 00 FF 01 02 00 FF 02 02 00 FF 02 FF 01 02 00 FF 01 02 00 FF 02 02 00 FF 00 00 00 00 00 00 00 00;
and its HEX DNA expression, without zeros as a check, would be:
09 01 09 03 2D 05 FA 91 78 08 02 0C 0C 2A 7B F8 53 10 FF 0E 02 2C 02 10 05 52 8F. Note that another pass to compress the DNA expression would result in an expansion because there are almost no repeat numbers and none that repeat enough that their normal minimum size of 6 bytes DNA representation would be smaller than their direct expression. As a quick check to avoid the waste of computer time to compute of the next level of DNA representation and a comparison to see if any compression took place, a calculation to see if the total elements divided by element types present equals less than six can be done, in which case no compression normally could take place, and a recursive DNA determining process can be automatically stopped.

From the above, it should be obvious that having 256 element types means that a totally mixed file is likely to require at least 256×6 bytes for the DNA representation and the DNA process needs to be run about 255 times plus BOUNCES per pass. Therefore, to reduce the number of DNA processes that need to be performed, the first thing that can be done is to convert the file to OCTAL, even though this can have the effect of expanding the file to three times its original size. Conversion of the file to OCTAL representation means there are much fewer ELEMENT TYPES to work with, 0–7 instead of 0–255. If the file was converted to binary there would be only 2 ELEMENT TYPES to work with and only one of those needs to be expressed, but OCTAL with the expression of 7 ELEMENT TYPES and the implication of the eighth ELEMENT seems to be a good compromise for speed and simplicity and requires only seven plus BOUNCES DNA processes. For example, if the original file is:
053 107 128 073 254 099 120
its octal conversion of the numbers to the base ten ($X_{10}$) is determined by the formula:

$$10\left(int\frac{X_{10}}{8}\right) + \left\{X_{10} - \left(int\frac{X_{10}}{8}\right)\right\} = X_8 \text{ which are:}$$

0 6 5 1 5 3 2 0 0 1 1 1 3 7 6 1 4 3 1 7 0.

Using a pre-OCTAL conversion, typical data lossless compression ratios are: Average 1 to 2 k files, 4.8–5.1 to 1 after one pass; Average 2.5 to 10 k files, 5.4–5.8 to 1 after one pass, 30–33 to 1 after two passes, and 100–125 to 1 after three passes; and for Average 10 k+files, 5.9 to 1 after one pass, 35 to 1 after two passes, and 140+to 1 after three passes.

With some types of files, it is better to convert the raw file to simple HEX before the DNA process is applied. For example, if the raw data file is 255 94 36 94 255 28 14 127 123 94 etc., then its normal HEX conversion would be FF 5E 24 5E FF 1C 0E 7F 7B 5E etc. but is simple HEX F F 5 E 2 4 5 E F F 1 C 0 E 7 F 7 B 5 E etc. so that the file can be processed using 0 through F, (sixteen numbers). If the raw data file had been 9 9 9 9, then the above conversion would result in 0 9 0 9 0 9 0 9 which would require additional processing and be represented as 6 0 4 0 6 14 6 9 4 1 7 14. The solution is to do odd/even processing, that is look to the odd positions and the even positions separately so that thirty two rather than sixteen numbers (0–15) need be represented because in totally random data, the even positions (0, 2, 4, etc.) are likely to have a zero 62.5% of the time. For example the even areas would be 0 0 0 0 and have a DNA representation of 5 0 4 0 3, whereas the odd areas would be 9 9 9 9 and have a DNA representation of 5 9 4 1 4.

Prescanning of the data can be used to increase compression. For example if the raw data was 1 1 1 1 0 0 0 0 0 0 1, DNA compression to the right would result in a COUNT of 210. However if the 1 bit flag in the byte count number is set to indicate reverse compression (to the left) then the COUNT is six, since only one "1" ELEMENT needs to be moved. This reversal can be done only once for a given block of data but it does significantly increase the compression ratio.

The advisability of forced bounces may also be determined during a prescan. If the original data was 5 5 5 5 5 5 5 5 5 0 8 9 4 3 4 3 4 0 0 0 5 5 5 5, the first nine "5"s can be represented as 5 5 9 0 8 in an exclusive forced bounce to avoid a COUNT of 75,582 that would occur if they were clumped with the four "5"s at the end.

A HEADER must be added to the processed DNA file so that the DNA representation can be decompressed to its original state. When multiple files are concatenated, each header attached to the file must be processed with the data as it is concatenated. The first byte of the HEADER is the length of the HEADER itself. The first byte also indicates where the start of the actual DNA representation of the original data begins. The first byte limits the length of the HEADER to a maximum of 255 characters when eight bit bytes are being used. The second byte is used to indicate the file type and can be made to conform to any desired standard. For example: the value "1" can be used to indicate a normal text file, not connected with a specialized word processing program; "2" a raw format picture file; "3" an executable program, executable; "4" a spread sheet data; and so on. The third, fourth, and fifth bytes are used to indicate the size of the original file. The sixth byte is used to indicate whether and what size DNA TABLE was used exclusively in the compression process, whether the DNA FORMULAS were used exclusively in the compression process, or whether both a DNA TABLE and DNA FORMULAS were used in the compression process. Under normal circumstances the DNA TABLE and the DNA FORMULAS give the same result, so the sixth byte may be eliminated. In some instances however, primarily when a limited size table is used to control BOUNCES, the information contained in the sixth byte is needed. Since only two bits may be needed to express this information, they can be parsed into the fifth byte if the original file or file block is less than 4,194,304 bytes in size. The seventh byte is used to indicate how many bytes are used to represent each number in the DNA table and the eighth byte is used to indicate the width of the table. The ninth byte is used to indicate table depth and the tenth to indicate table range. Of course, if the sixth byte indicates that no table was used, the seventh, eighth, ninth, and tenth bytes can be eliminated. The eleventh byte is used to indicate the number of times the DNA process was used on the file and the twelfth byte is used to indicate the size that triggers a BOUNCE (BOUNCE SIZE), which is the MAXIMUM size of the COUNT field in bytes)

If the count size field is set at twenty bytes maximum, and the DNA table number size is set at 16 bytes wide, when the sixteen byte wide numbers get added together as compression takes place, the values will increase until a bounce takes place or the number exceeds twenty bytes, the maximum defined. This is part of what makes DNA dynamic. These and other variables can be adjusted to suit the needs of a user, increase or decrease compression relating to the type of data represented or the speed and memory capabilities of the users computer. The number of recursions is also related to compression or the needs of the user and is directly related to the speed and memory of the hardware. The larger the numbers generated using the DNA formulas, or placed into a DNA table, the more flexibility the user has to compress files. The thirteenth and fourteenth bytes are used to indicate the MEMORY PROCESS SIZE, that is the amount of memory allocated to the original file size for processing. The fifteenth through twenty sixth bytes normally are used to retain the name of original file, usually in the form of <label>.<ext>, if the file is a PC file. The twenty seventh byte is used as a flag for the existence of multiple files, the twenty eighth byte is used to indicate the number of files that have been concatenated, and the twenty ninth byte is used to indicate the order and direction of the concatenated files. With this information, a hashing method may be used to "unfold" the various files much like seeking a specific card in a deck of cards without looking at or regenerating all of the cards in between. Additional bytes up to the maximum 256 bytes indicated by the first byte can be used for trademarks, copyright and patent notices when applicable, software serial numbers, encrypted passwords, and the like.

DNA compresses a representation of all data elements as they are encountered during a compression pass. Each ELEMENT is associated with its appropriate ELEMENT GROUP until the original file is totally converted to its DNA representation. The resulting representation is then concatenated to the smallest possible size. The header information is generated and the entire process can be repeated if necessary. DNA decompression is fairly simple.

To decompress the data, each ELEMENT TYPE BLOCK is processed in the following manner.

The END LOCATION, or the START LOCATION, if the ELEMENT COUNT is 0, is retrieved and an ELEMENT is placed in a regeneration array the size of the original memory process size. As the END LOCATION is decremented toward the START LOCATION, the ELEMENT COUNT is computed using the DNA TABLE or DNA FORMULA (1). If the value derived from the table or formula is larger or equal to the BLOCK COUNT, an ELEMENT TYPE is placed at the current location and the process continues. If the value computed is smaller than the BLOCK COUNT, the END LOCATION is decremented and the process repeated. This process takes place until the elements from the current block are back in their original positions. To speed regeneration, the process also looks for an ELEMENT at the current location in the regeneration array before computing the possibility of placing a new element at that location, since if the position is already filled, the value computed will always be smaller than the BLOCK COUNT. DNA does not have to process the largest BLOCK or BLOCKs of the same ELEMENT TYPE if they are the last group or groups to be processed, since the blank spaces can be just filled as necessary. Usually, the 0's in picture data or the spaces in text data are the ELEMENT TYPEs present in the largest number.

For example, to convert the DNA FILE 6 4 4 6 12 10 back to its original file structure, the END LOCATION is determined in a matrix the length of the original file, 0 0 0 0 0 0 0 0 0 0 0 0 0 0 0 0 0 0 0 0 0 0 0 an element is placed at that spot. 0 0 0 0 0 0 0 0 0 0 0 0 44 0 0 0 0 0 0 0 0 0 0 0 0 and the element counter is decremented, 6 4 3 6 12 10 and starting at the START LOCATION, a computation is accomplished to determine if the remaining two ELEMENTs will fit in the allotted space (from the $4_1$ to the $4_4$) that is $4_1$ $4_2$ $4_3$ 0 0 0 $4_4$ would have a COUNT of 19 which is more than 10 and 0 0 0 $4_1$ $4_2$ $4_3$ $4_4$ would have a count of 0 so a count of 10 there between will fit. The count of 19 can be determined either by reference to a DNA Table or through use of the DNA Formula. In the Table, RANGE is remaining element COUNT total (9), minus range (6) between START LOCATION and END LOCATION or 3 and three ELEMENTs are to be placed. After computing the possible value from the DNA TABLE or using DNA FORMULA #1, a determination is made that the element group of 3 cannot have moved all the way to the right, up against the last element, since the computed number (20−1=19) from the Table or from the Formula $$A = \left\{ (y+2)\left(\frac{(y+1)}{2}\right)\left(1+\frac{y}{I}\right) \right\} - 1 \quad (3)$$

where I=3, y=3
A={5 * 2 * (1+1)}−1
A=20−1
A=19 is larger than the count, 10. Therefore, the END COUNTER is decremented and the results are recomputed until all elements are placed in their original positions ($4_1$ $4_2$ 0 0 $4_3$), the next choice has a count of (9) which is too low so the $4_3$ must be moved to the left to increase the count by one so the placement must be 0 0 0 0 0 0 0 4 4 0 4 0 4 0 0 0 0 0 0 0 0 0 0 0 0.

When all elements for the block are located to their original positions, The STARTING LOCATION has an ELEMENT in it. Obviously that ELEMENT could have been placed there at the start of processing. However, the value for movement of the remaining elements would thereafter be incorrect. However, once all elements of a BLOCK have been repositioned, the STARTING LOCATION can be examined and used as a CHECK or CHECKSUM to assure that reproduction of the original file has been accomplished. There is overhead involved in compressing files that is not involved in decompressing the files, so that decompression is always faster than compression. This is desirable when real time data such as video is being compressed, transmitted, and then decompressed.

The DNA compression/decompression methods discussed above work best when same type elements or same type element blocks are in close relative proximity to each other in the data being processed. The closer together these clusters of same type elements are, the higher the compression ratio. Therefore, the DNA offset method and a DNA file sieve processing method are used to enhance the DNA movement methods.

The DNA offset method compliments the DNA movement methods by bringing like elements and like element blocks into closer relative proximity before DNA movement, by noting the distances between elements or element blocks and removing those distances before the DNA movement methods are implemented. The DNA offset method decreases the number of instructions required to compress and decompress data significantly. The DNA offset method also reduces the total movement value generated by the DNA movement methods. The increase in the number of elements processed in a block of DNA movement representation is increased substantially, while the number to represent their movement is decreased substantially. The DNA offset method does generate additional information, which is appended to the DNA movement representation. The enhanced ability to place more information into the DNA movement blocks is more than offset by the small amount of space the DNA OFFSET representation uses. Overall, the effect is greater compression and greater decompression speed.

As described below, the DNA file sieve also reduces the distance or range of spaces between like elements or elements groups by removing like element types or groups from the original file, processing them with the DNA OFFSET method (if necessary), processing them through the DNA movement method and noting that these element blocks and groups are now removed from the original file. When the next element group type is processed, each space that the previous element group type took up in the original file, is ignored. As each subsequent element type is processed, the spaces that were taken by all of the previously

TABLE 2

| | | LARGEST NUMBER OF ELEMENTS or RANGE (across) | | | | | |
|---|---|---|---|---|---|---|---|
| | | 2 | 3 | 4 | 5 | 6 | 7 | etc. |
| SMALLEST | 1 | 3 | 4 | 5 | 6 | 7 | 8 |
| NUMBER OF | 2 | 6 | 10 | 15 | 21 | 28 | 36 |
| ELEMENTS | 3 | | 20 | 35 | 56 | 84 | 120 |
| OR RANGE | 4 | | | 70 | 126 | 210 | 330 |
| (down) | 5 | | | | 252 | 462 | 792 |
| | 6 | | | | | 462 | 924 | 1716 |
| | 7 | | | | | | | 3432 | processed group element types are ignored. The overall effect of the DNA file sieve method is to reduce the space between like elements dynamically during processing. The DNA file sieve method does not require any information be appended to the numeric representation of DNA movement. Generally, the DNA sieve method is used for archival purposes, when the file size is to be reduced as much as possible, the file size is at least 10K, the compression of any type of file is desired and real time compression is not required. Test files or file portions of at least 10K in size show an average 8:1 compression ratio on the first pass.

FIG. 3 illustrates a complete compression of a small data file with FIG. 4 illustrating its decompression. Note that during decompression, as each element group is processed (before being combined with the previously processed groups of elements) each of its independent elements remain stationary. The previously processed elements are 'shuffled' back into positions between the current element groups until another current element is encountered. The remaining previously combined groups of elements are moved to the right as necessary. It would seem apparent that further compression could be achieved if the "best" element was removed first. However, at this time, other than trying all possible orders and determining which compresses the most, a logic as to which is best has not been determined.

When a block of same type elements are located (50005550050050005), type offset procedure still functions by taking out a small offset space, i.e. (5 00555 05 05 005) to become (5005550505005), offset of one. The resultant block (for decompression purposes) is treated as one element when restoring zeros between elements. If a cluster of data (500500500050005) does not contain a block, i.e. (555505) offset of two, then the notation for offsets element type is left alone. If the offset does contain 1 or more blocks, the high bit (128) is set to note this in the element type location of the notation. Therefore, normal offset notation is Element Type, Starting address, how many elements deep into the file this offset works with.

Figure 5:
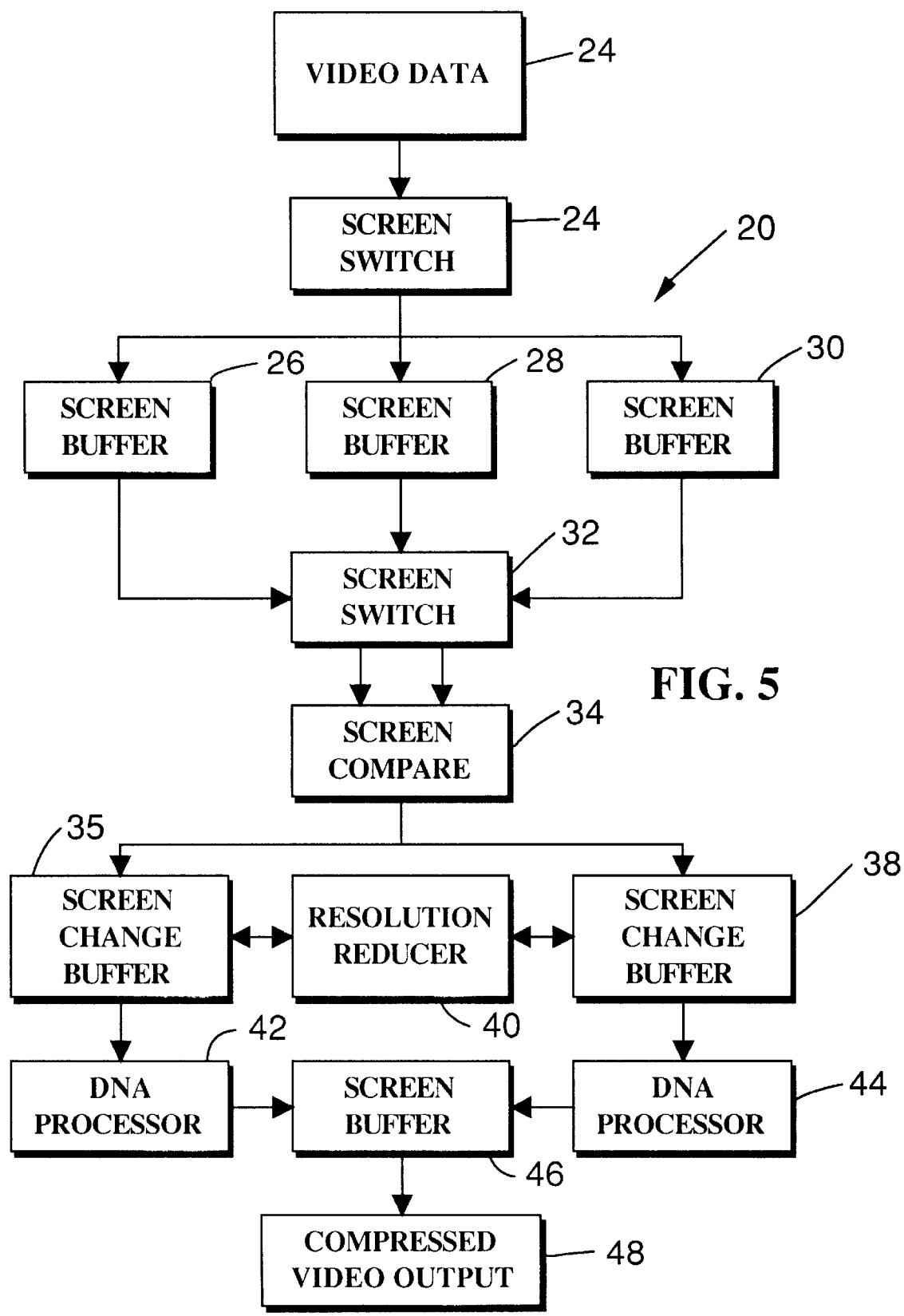
FIG. 5 is a block diagram of the present invention incorporated into a proposed real time video compression system.

FIG. 5 illustrates how the present method can be incorporated into a video data compression system 20 being considered for the transmission of high definition video within the current over-the-air channels. The video data 22 passes through a screen switch 24 which causes a screen buffer 26 to fill. When the buffer 26 is filled, the switch places the next screen of video data in screen buffer 28. While screen buffer 30 is being filled with an additional screen of video data, a second screen switch 32 passes the data in buffers 26 and 28 to a screen compare 34, which determines what, if anything, has changed from one screen to the next and the changes are placed in either screen change buffer 36 or screen change buffer 38. A resolution reducer 40 determines if too much data is present in a screen change buffer 36 or 38, and if so causes the buffer to output data at a low enough resolution that it can be processed and transmitted. Normally this occurs when a scene changes. The outputs of the screen buffers 36 and 38 are compressed in DNA processors 42 and 44 and alternately provided to a screen buffer 46, which provides the compressed video output 48. If sufficient computer power is provided in the DNA procesors, compression ratios can be high enough that the screen compare 34, the screen change buffers 36 and 38 and the resolution reducer 40 can be eliminated. Of course, this assumes that sufficient computer power is available at the receiver to decompress. Generally this is a question of economics and consumer demand.

Figure 6:
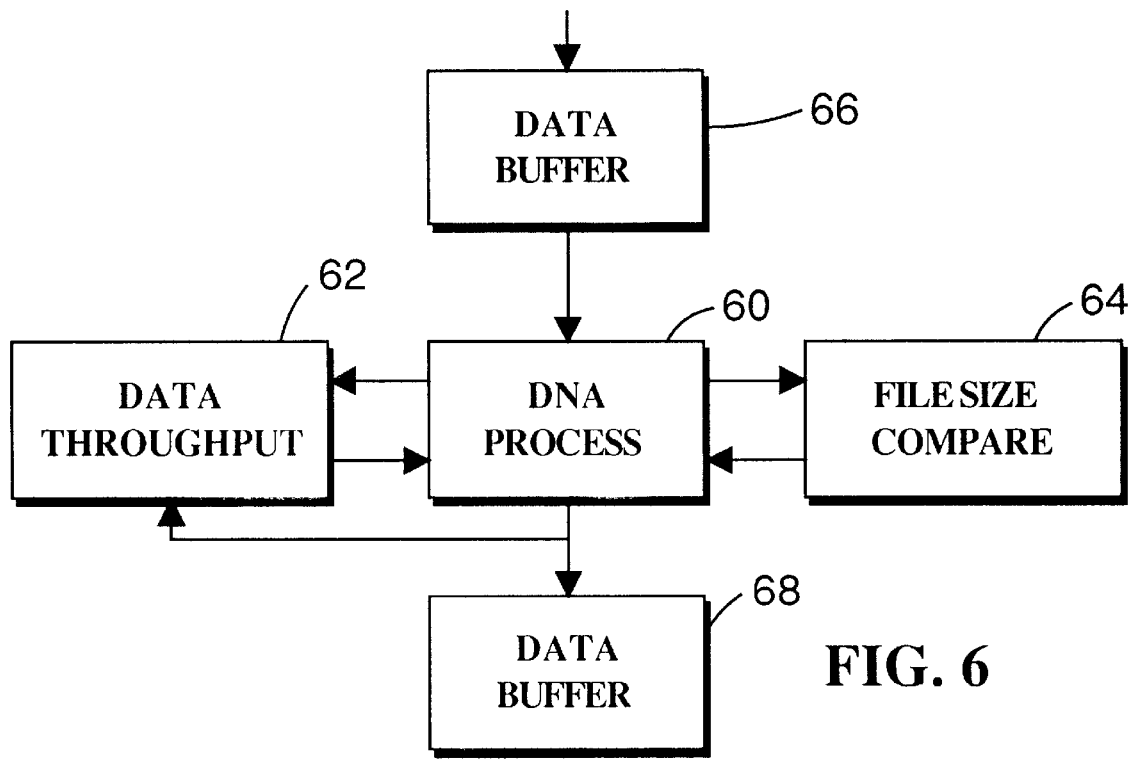
FIG. 6 is a block diagram of an automatic control system for the present invention.
Figure 7:
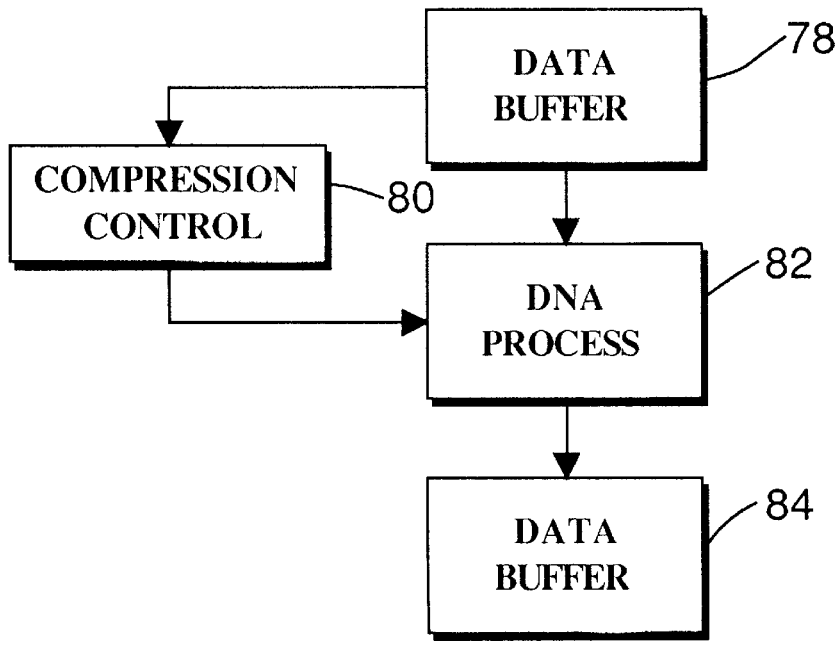
FIG. 7 is a block diagram of a method to provide compression control of the present invention.

The DNA process can vary compression as it is needed, compressing deeper when sufficient time will be present at the receiver for decoding. As shown in FIG. 6, the DNA process 60 can use a feedback of data throughput 62 and or a file size compare 64 to determine haw much compression has occured to vary the compression process as data travels from in input data buffer 66 to an output data buffer 68. Generally the control is of how many passes data goes through the DNA process and whether a prior pass actually reduced the file size enough to warrant the time that will be required for decompression of the additional pass. In cases where the data must be reduced an optimal amount based on the amount of input data being received at an input data buffer 78, (FIG. 7), a compression control 80 that senses the amount of data in a data buffer 82 is used to determine whether there is sufficient time available befor the buffer 78 fills up, for the DNA process to make another compression pass before outputting the compressed data to an output data buffer 84.

When transmission of the digital data is subject to interference, such as over-the-air digital video, random bits of the compressed data can be lost. The present compression and decompression process cannot tolerate a single missing bit in any block of data or the entire block will be lost. Therefore, additional features must be added if data integrity is to be assured when using transmission methods that are likely to pass uncorrected errors. As a first way to make sure that all bits have been received, a conventional parity check can be performed. When a full duplex data system is present, parity check failure can trigger a request that the data be resent. In data transfer systems, such as those that transmit digital video, the parity check can be used to prevent display of the new, imperfect data. However, present plans are to only send changes to the video image, and without a feedback mechanism, a ghost of the missing change would linger until that pixel is changed again. When only a few pixels are involved or the picture is changing rapidly, the "ghost" might not be noticeable. However, a transmission loss when a small, fast moving image is moving on a unchanging background might result in a lingering stationary artifact of the image.

One way to eliminate such artifacts relies on the fact that the data transmission system must have sufficient capability for large changes and the artifacts are likely to occur when the scene is relatively stationary, and excess data transmission capacity exists. In such cases, a portion of each transmission block can be a duplication of a portion of the scene as it should exist, with a concentration on portions of the scene that recently has been changed. If a discrepancy exists, then the new parity checked data is used to overwrite the discrepant area. Except in cases of high interference, where picture freeze might occur, any discrepancy should be overwritten in less than five screen changes, which means the discrepancy should be visible for less than a third of a second.

Another way to improve the reliability of one way communication of compressed video is to send the previous frames element blocks checksums at the beginning of every frame (1 byte for every block and this new frame checksum group). A 1 byte checksum is sent with every element block. Then at the end of every picture frames, the checksums for each element block in an array again. During decompression, if an element being placed hits a non 0 location, the checksums are referred to to find out which element block is incorrect, the one previously placed without errors or the new element block to be placed. By marking the element block group that is incorrect and continuing processing, since any element block being laid down after the error is found, could refer to the erroneous block start and end groups and still lay down its elements over the top of the erring block. The compressed frame is broadcast a second time, review the checksum and decompress only the erring element blocks.

Another error correction technique is that when an error is found during decompression:

```
array formed       0000000000
1's                1000001001
2's being placed   1000001021
``` like when a check of checksums reveals an error in the 2's checksum where the decompression result would put a 2 at the second 1's location, mark 2's as a corrupted group and fill all remaining 0's locations for that block group with 2's so the result is

1222221221

Then decompress the remaining element blocks with correct checksums so the result is:

1324321421 which should be correct. For redundancy, the checksums at the beginning, middle and ending of each file may be saved.

The values in Tables (1) or (2) that represent the actual movement do not have to be sent, but only the position in the table, since the actual movement values always re-construct to the same positions in either Table. The Table also can be filled with pseudo values that are smaller than the actual values, so long as exceptions are not created. In this case, an "exception" is an accumulation of a value in the Table during compression that during decompression, results in incorrect processing of that element group resulting in failure to place the elements back in their original positions.

Thus there has been shown and described a novel method for compressing and decompressing digital data that fulfills all of the objects and advantages sought therefor. Many changes, alterations, modifications and other uses and applications of the subject compression and decompression method will become apparent to those skilled in the art after considering the specification together with the accompanying drawings. All such changes, alterations, and modifications that do not depart from the spirit and scope of the invention are deemed to be covered by the invention, which is limited only by the claims that follow:

I claim:

1. A numeric method to compress a digital data file including the steps of:

(a) determining and storing numbers present as elements in the data; and then for at least all types of elements but one present, (b) determining and storing the number of the element present;

(c) determining and storing the location in the data of the first one of the element;

(d) determining and storing the location in the data of the last one of the element;

(e) determining and storing the count of movements required to move a group of the element together toward an end element by moving the opposite end element until it is adjacent an element, moving the adjacent element toward the end element while moving the opposite end element back to its original position and so on until the elements of a single type are grouped together; and (f) organizing the stored types of elements, numbers of element, locations of first and last element, and count, and a representation of the number of bytes used to express such stored types of elements, numbers of element, locations of first and last element, and count, into a representation of the digital data file.

2. The numeric method to compress digital data as defined in claim 1 including the additional step of:

providing a header to the representation of digital data that at least includes:
a representation of the length of the header;
a representation of the size of the digital data file;
a representation of the number of times said numeric method has been used on the digital data file; and
the identity of the digital data file.

3. The numeric method to compress digital data as defined in claim 1 including the additional steps of:

setting a maximum count;
determining when movement of a group of an element together will exceed the maximum count;
reducing the group of an element that exceeds the maximum count until the maximum count is not exceeded; and
representing the type of element of the group, numbers of the element in the group, locations of first and last element of the group, and count to move the group together, and a representation of the number of bytes used to express such type of element of the group, numbers of the element in the group, locations of first and last element of the group, and count to move the group together, into a representation of the group of elements.

4. The numeric method to compress digital data as defined in claim 3 including the additional step of:

providing a header to the representation of digital data that at least includes:
a representation of the length of the header;
a representation of the size of the digital data file;
a representation of the number of times said numeric method has been used on the digital data file;
a representation of the maximum count; and
the identity of the digital data file.

5. The numeric method to compress digital data as defined in claim 3 including the additional step of:

providing a header to the representation of digital data that at least includes:
a representation of the length of the header;
a representation of the size of the digital data file;
a representation of the number of times said numeric method has been used on the digital data file;
a representation of the maximum count;
a representation of the amount of memory allocated to the original digital data file size for processing; and
the identity of the digital data file.

6. The numeric method to compress digital data as defined in claim 1 including the additional step of:

converting the digital data file into simple HEX before step (a).

7. The numeric method to compress digital data as defined in claim 1 including the additional steps of:

converting the digital data file into simple HEX before step (a); and
performing the steps (a) through (f) separately for odd and even positions in the simple HEX.

8. The numeric method to compress digital data as defined in claim 1 wherein if only one of a type of element is present so that the location of the first and last element is the same, then concatenate the result of step (f) by eliminating a representation of the location of the last element and the count.

9. The numeric method to compress digital data as defined in claim 1 including the additional step of:
converting the digital data file into a base 2 less than $2^8$ before step (a).

10. The numeric method to compress digital data as defined in claim 1 wherein the element zero is not processed.

11. The numeric method to compress digital data as defined in claim 1 including the additional step of:
determining the element type most numerous in the digital data file; and
block procession of the element type most numerous.

12. The numeric method to compress digital data as defined in claim 1 including the additional step of:
generating a lookup table of counts having ordinates of range between elements and number of elements, wherein step (e) includes determining the count from the lookup table.

13. The numeric method to compress digital data as defined in claim 1 wherein step (e) includes determining the count (A) from the formula $$A = \left\{ (y+2)\left(\frac{(y+1)}{2}\right)\left(1+\frac{y}{I}\right) \right\} - 1$$

where y is the range or number of spaces to move and I is the total number of elements moving.

14. The numeric method to compress digital data as defined in claim 1 including the additional step of:
generating a lookup table of counts having ordinates of range between elements and number of elements, wherein step (e) includes determining the count either from the lookup table or from the formula $$A = \left\{ (y+2)\left(\frac{(y+1)}{2}\right)\left(1+\frac{y}{I}\right) \right\} - 1$$

where A is the count, y is the range or number of spaces to move and I is the total number of elements moving.

15. The numeric method to compress digital data as defined in claim 14 including the additional step of:
providing a header to the representation of digital data that at least includes:
a representation of the length of the header;
a representation of the size of the digital data file;
a representation of the number of times the numeric method has been used on the digital data file;
a representation of the maximum count; and
a representation of whether the lookup table, the formula or a combination of both was used to determine the count in step (e).

16. The numeric method to compress digital data as defined in claim 1 including the additional steps of:
setting a maximum count;
determining when movement of a group of an element together will exceed the maximum count;
reducing the group of an element that exceeds the maximum count until the maximum count is not exceeded; and
representing the type of element of the group, numbers of the element in the group, locations of first and last element of the group, and the count to move the group together, and a representation of the number of bytes used to express such type of element of the group, numbers of the element in the group, locations of first and last element of the group, and count to move the group together, into a representation of the group of elements.

17. The numeric method to compress digital data as defined in claim 16 including the additional step of:
providing a header to the representation of digital data that at least includes:
a representation of the length of the header;
a representation of the size of the digital data file;
a representation of the number of times the numeric method has been used on the digital data file;
a representation of the maximum count; and
the identity of the digital data file.

18. The numeric method to compress digital data as defined in claim 1 wherein the representations are temporarily stored in a first representation table of fixed size, including the additional step of:
concatenating the first representation table into a second representation table by eliminating space therefrom for element types that are not present; and reducing space for element types that can be represented in less than six bytes.

19. The numeric method to compress digital data as defined in claim 18 including the additional step of:
providing a header to the representation of digital data that at least includes:
a representation of the length of the header;
a representation of the size of the digital data file;
a representation of the number of times the numeric method has been used on the digital data file;
a representation of the number of data files that have been compressed;
a representation of the number of files that have been concatenated;
a representation of the order and direction of the concatenated files; and
the identity of the digital data files.

20. The numeric method to compress digital data as defined in claim 1 wherein the data is a text file and the representations of spaces are not processed.

21. The numeric method to compress digital data as defined in claim 1 wherein the data is a text file in hexadecimal form and even number zeros and representations of spaces are not processed.

22. The numeric method to compress digital data as defined in claim 1 including the additional step of:
removing all of the occurrences of an element in the data file after such element has been processed in steps (b) through (f) whereby the file size is reduced prior to performing steps (b) through (f) on the next element.

23. The numeric method to compress digital data as defined in claim 22 wherein the element first processed in steps (b) through (f) is the first element that occurs in the file.

24. The numeric method to compress digital data as defined in claim 22 wherein the element first processed in steps (b) through (f) is the last element that occurs in the file.

25. The numeric method to compress digital data as defined in claim 22 wherein the element first processed in steps (b) through (f) is the first non-zero element that occurs in the file.

26. The numeric method to compress digital data as defined in claim 22 wherein the element first processed in steps (b) through (f) is the last non-zero element that occurs in the file.

27. The numeric method to compress digital data as defined in claim 1 wherein the data is a text file in hexadecimal form and even number zeros and representations of spaces are not processed.

28. The numeric method to compress digital data as defined in claim 1 wherein before steps (b) through (f) are performed for an element, determining if at least one space is present between all occurrences of the element, and if so offsetting toward the last occurrence of the element all but the last of such elements by the largest number of spaces present between all occurrences of the element, and recording the offset for decompression purposes.

29. The numeric method to compress digital data as defined in claim 28 including performing step (e) from opposite ends of the offset elements and recording which step (e) results in a smaller count and such smaller count.

30. The numeric method to compress digital data as defined in claim 1 wherein before steps (b) through (f) are performed for an element, determining if at least one space is present between all occurrences of the element, and if so offsetting toward the first occurrence of the element all but the first of such elements by the largest number of spaces present between all occurrences of the element, and recording the offset for decompression purposes.

31. The numeric method to compress digital data as defined in claim 30 including performing step (e) from opposite ends of the offset elements and recording which step (e) results in a smaller count and such smaller count.

32. A method of compressing digital data into a form that can be decompressed to the original data that includes:

determining the pattern of occurrence of a first element type present in the digital data between two elements of the first element type by:
determining the total count of element movements toward a stationary element that would be required to move all of the elements of the first element type together by moving one of the two elements toward the other of the two elements, which is the stationary element, until the moving element is adjacent another of the elements of the first element type, moving the adjacent element one position toward the stationary element of the two elements while resetting the moving element of the two elements back to its original position and so on until all of the elements of the first element type are grouped together adjacent the stationary element.

33. The method of compressing digital data into a form that can be decompressed to the original data in accordance with claim 32 further including:

determining the pattern of occurrence of a second element type present in the digital data between two elements of the second element type by:
determining the total count of element movements toward a stationary element that would be required to move all of the elements of the second element type together by moving one of the two elements toward the other of the two elements, which is the stationary element, until the moving element is adjacent another of the elements of the second element type, moving the adjacent element one position toward the stationary element of the two elements while resetting the moving element of the two elements back to its original position and so on until all of the elements of the second element type are grouped together adjacent the stationary element.

34. The method of compressing digital data into a form that can be decompressed to the original data in accordance with claim 32 further including:

determining the pattern of occurrence of at least all but one of other element types present in the digital data in the same manner as the determination of the pattern of occurrence of the first element type.

35. The method of compressing digital data into a form that can be decompressed to the original data in accordance with claim 34 wherein during the step of determining the pattern of occurrence of at least all but one of other element types present in the digital data in the same manner as the determination of the pattern of occurrence of the first element type, the pattern of occurrence of zero is determined in another manner.

36. The method of compressing digital data into a form that can be decompressed to the original data in accordance with claim 32 further including:

temporarily storing the representations of the pattern of occurrence along with number of occurrences, location of first occurrence and location of last occurrence in the form of representation digital data;

determining the patterns of occurrence of the elements of the representation of digital data; and recursively temporarily store and determine until no appreciable compression takes place.

37. The method of compressing digital data into a form that can be decompressed to the original data in accordance with claim 36 further including:

determining the element whose representation of pattern of occurrence is largest; and eliminate that representation of determining the pattern of occurrence from storage.

38. A method of decompressing a block of digital data of known size that has been compressed by determining the pattern of occurrence of at least all but one element types present in the digital data by determining the total count of element movements toward a stationary element that would be required to move all of the elements of each element type together by moving one of the two elements toward the other of the two elements, which is the stationary element, until the moving element is adjacent another of the elements of the first element type, moving the adjacent element one position toward the stationary element of the two elements while resetting the moving element of the two elements back to its original position and so on until all of the elements of the first element type are grouped together adjacent the stationary element including the steps of:

(a) establishing a matrix of the known original size; and (b) reversing the element movement process for each element until the matrix is filled with at least all but one element.

* * * * *